(12) United States Patent
Hong

(10) Patent No.: US 7,790,609 B2
(45) Date of Patent: Sep. 7, 2010

(54) METHOD OF FORMING METAL LINE IN SEMICONDUCTOR DEVICE

(75) Inventor: Ji-Ho Hong, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 326 days.

(21) Appl. No.: 11/850,267

(22) Filed: Sep. 5, 2007

(65) Prior Publication Data

US 2008/0061438 A1    Mar. 13, 2008

(30) Foreign Application Priority Data

Sep. 8, 2006    (KR) ...................... 10-2006-0086661

(51) Int. Cl.
*H01L 23/52* (2006.01)
(52) U.S. Cl. ............... 438/645; 257/E21.577
(58) Field of Classification Search ........... 257/751, 257/E21.577, E23.168; 438/645
See application file for complete search history.

(56) References Cited

U.S. PATENT DOCUMENTS 7,064,064 B2 * 6/2006 Chen et al. ............... 438/672

2006/0172528 A1   8/2006   Lee

* cited by examiner

*Primary Examiner*—Roy K Potter
(74) *Attorney, Agent, or Firm*—Sherr & Vaughn, PLLC

(57) ABSTRACT

A method of forming a metal line in a semiconductor device is disclosed. The method of forming a metal line in a semiconductor device includes forming an interlayer insulating film over a substrate. A via hole may be formed by selectively patterning the interlayer insulating film. A metal film may be formed over a surface of the interlayer insulating film including an inner portion of the via hole. The inner portion of the via hole may be filled with copper. A copper layer exposed over the surface of the interlayer insulating film may be deplated using reverse current to form a copper metal line and a recess region over the copper metal line. An upper insulating film may be formed over the surface of the interlayer insulating film including the recess region by deposition. An insulating cap layer may be selectively formed over only the recess region on the copper metal line by etching the upper insulating film. The upper insulating film and the insulating cap layer may be made of a compound selected from a group including SiN, SiCN and SiOC. An upper insulating film may be deposited over the surface of the interlayer insulating film using a thermal deposition method or a plasma deposition method.

12 Claims, 3 Drawing Sheets

METHOD OF FORMING METAL LINE IN SEMICONDUCTOR DEVICE

Figure 1A:
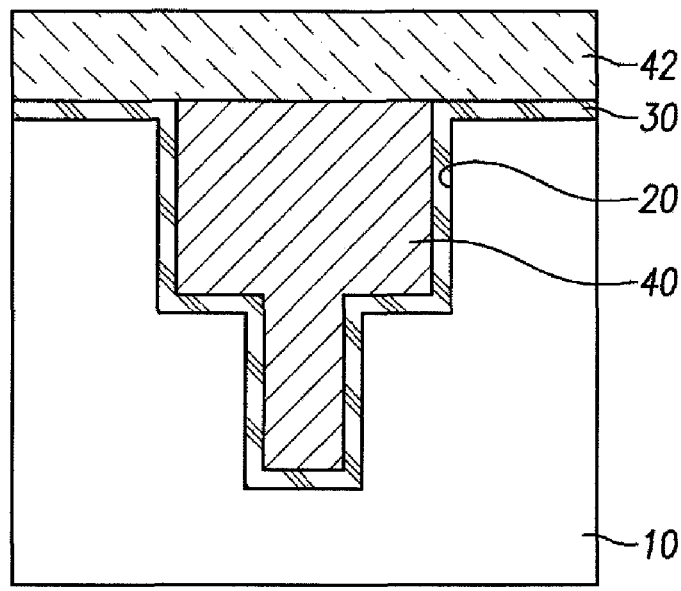
Figure 1B:
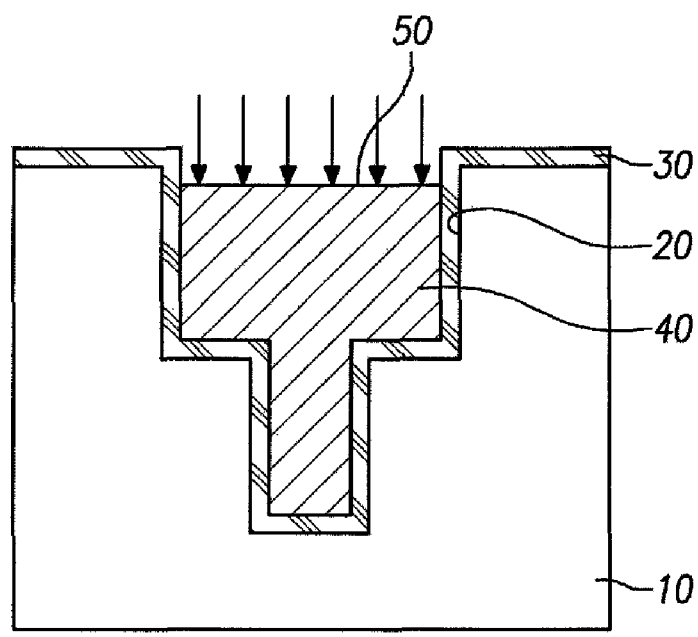

The present application claims priority under 35 U.S.C. 119 to Korean Patent Application No. 10-2006-0086661, filed on Sep. 8, 2006, which is hereby incorporated by reference in its entirety.

BACKGROUND

Along with the trend of ever larger scale integration of semiconductor devices and reductions in chip size, miniaturization of metal lines and multi-layer wiring is accelerating. In a logic device having a multi-layer wiring structure, wiring delay is an important component of an overall device signal delay. The wiring delay is in proportion to a product of wiring resistance and wiring capacitance. Reducing the wiring resistance and capacitance reduces the wiring delay.

To reduce the wiring capacitance, a metal line may be formed of a copper material having a low resistance instead of an aluminum. It is, however, extremely difficult to simply pattern Cu to form the metal line. A damascene process may be used, in which an opening such as a wiring groove or a connection hole (via-hole) in an insulating film is filled with copper to form a metal line.

When a copper metal line is formed by a damascene process, a diffusion barrier film is formed to cover the inner wall of the opening with a metal seed layer before filling in the opening with copper to prevent copper from being diffused into the insulating film. The metal seed layer for a diffusion barrier film employs metal such as Ta or W having a high insulating value and a high melting point. Along with the trend of miniaturization of the Cu metal line, there is a drawback of increasing the RC delay of Back End Of Line (BEOL) wiring due to a relatively high effective dielectric value (k) of the diffusion barrier film. Particularly, when a highly miniaturized wiring layer including a via hole having a diameter of approximately 0.1 μm and a metal line having a width of approximately 0.1 μm employs metal such as Ta or W having a high melting point, there is a drawback of considerably increasing the wiring resistance and contact resistance.

SUMMARY

In order to overcome the drawbacks, the metal seed layer may be selectively used as an insulating layer (metal capping layer) for Cu wiring using a wet process to secure reliability of the wiring and reduce the RC delay.

Embodiments relate to a method of forming a metal line in a semiconductor device, and more particularly to a method of forming a metal line in a semiconductor device capable of reducing an effective dielectric value k of an interlayer insulating film in a copper metal line to decrease delay of a time constant (RC) of the metal line by selectively forming an insulating film over the metal line.

Embodiments relate to a method of forming a metal line in a semiconductor device which includes forming an interlayer insulating film over a substrate. A via hole may be formed by selectively patterning the interlayer insulating film. A metal film may be formed over a surface of the interlayer insulating film including an inner portion of the via hole. The inner portion of the via hole may be filled with copper. A copper layer exposed over the surface of the interlayer insulating film may be deplated using reverse current to form a copper metal line and a recess region over the copper metal line. An upper insulating film may be formed over the surface of the interlayer insulating film including the recess region by deposition. An insulating cap layer may be selectively formed over only the recess region on the copper metal line by etching the upper insulating film. The upper insulating film and the insulating cap layer may be made of a compound selected from a group including SiN, SiCN and SiOC. An upper insulating film may be deposited over the surface of the interlayer insulating film using a thermal deposition method or a plasma deposition method.

DRAWINGS

Example FIGS. 1A to 1E are cross-sectional views for explaining a method of forming a metal line in a semiconductor device according to embodiments.

DESCRIPTION

A semiconductor substrate for applying the embodiments may be a substrate which has transistors and components for forming a semiconductor device formed thereon. An Electro Chemical Plating (ECP) process may be performed to form copper metal lines over the substrate.

The method of forming metal lines in a semiconductor device according to embodiments includes a process for forming a copper metal line through a copper electro-chemical plating (ECP) process as shown in example FIG. 1A. The Cu ECP process is a generalized process for forming a metal line in the substrate.

A silicon oxide material or a low-k material is deposited over a substrate to form an interlayer insulating film 10. Then, an insulating film is selectively patterned using a photo-etching process and/or other etching technology to form a trench and a via hole 20. Then, a metal film 30 is deposited over the entire surface of the interlayer insulating film 10 including the via hole 20. The metal film 30 will prevent a copper metal line 40, to be formed later, from being diffused into the interlayer insulating film 10. For example, the metal film 30 may be formed of metal such as Ta or tungsten (W), which has a high insulation value and a high melting point.

Thereafter, after an accelerating agent may be coated over the surface of the metal film 30, copper is deposited in the via hole 20 using a gap filling process as shown in example FIG. 1A. The accelerating agent may be a material having sulfur (S) or nitrogen (N). For example, the accelerating agent may be a sulfonic acid based material, a disulfides based material, a mercapto compound, SPS, i.e., bis (sodium sulfopropyl)-disulfide, thiourea and the like.

The ECP process causes reverse current to flow over the substrate on which the gap filling process is performed. Accordingly, a deplating process is performed over a copper layer 42 exposed over the surface of the interlayer insulating film 10. The deplating process, as shown in example FIG. 1B, causes a recess region 50 to be formed over the copper metal line 40. The recess region 50 is a region slightly recessed downward from the surface of the metal film 30 over the interlayer insulating film 10 adjacent to the via hole 20. A partial insulating cap layer may be formed in the recess region 50 by etching an upper insulating film to be described later.

Figure 1C:
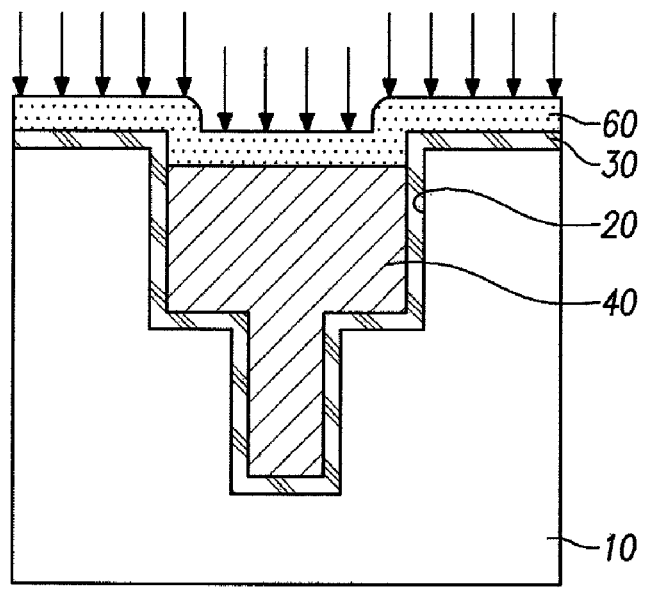
Figure 1D:
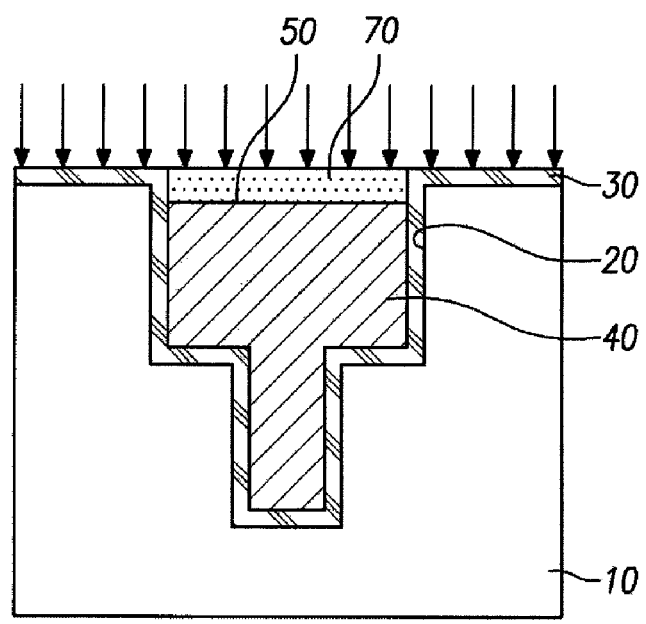

When the recess region is formed over the copper metal line 40 through a deplating process, an upper insulating film 60 may be deposited over the surface of the metal film 30 including the recess region 50 as shown in example FIG. 1C. The upper insulating film 60 can be made of any material effective for copper diffusion such as SiN, SiCN and SiOC. The upper insulating film can be deposited by a thermal deposition method or a plasma deposition method.

Finally, the upper insulating film 60 is removed through an etching process, specifically, CMP or wet etch, except for the recess region 50 over the copper metal line 40. As shown in example FIG. 1D, the upper insulating film remains on the recess region 50 to form an insulating cap layer 70 covering only the copper metal line 40.

According to embodiments, a selective insulating cap layer 70 may be formed covering only the copper metal line 40 instead of an upper insulating film entirely covering the interlayer insulating film. Accordingly, compared to a process of forming an insulating film entirely covering the interlayer insulating film as well as the copper metal line 40, it is possible to reduce an entire effective k of the copper metal line, thereby minimizing the RC delay.

Figure 1E:
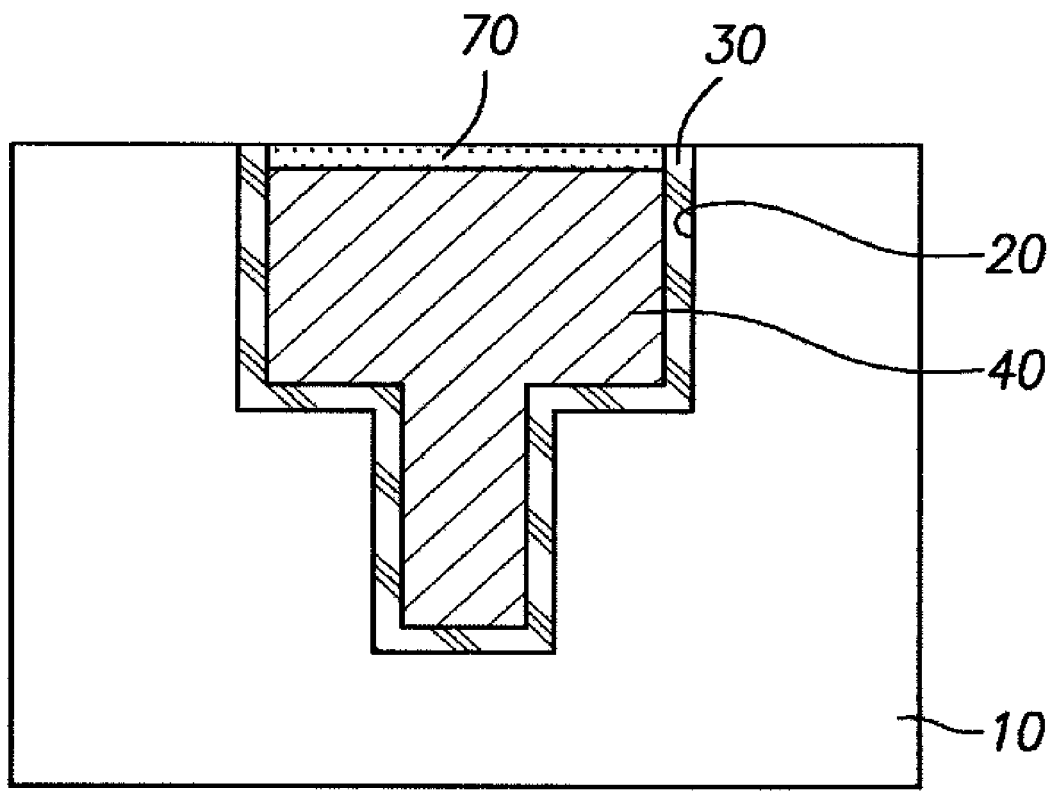

Referring to example FIG. 1E, a portion of the insulating cap layer 70 and the metal film 30 formed over the interlayer insulating film 10 are planarized through a Chemical Mechanical Planarization (CMP) process. After planarization, a thickness of the insulating cap layer 70 remaining over the copper metal line 40 may be approximately equal to a thickness of the metal film 30. The insulating cap layer 70 shown in example FIG. 1E serves as a diffusion barrier film for preventing copper of the copper metal line 40 from being diffused into an interlayer insulating film formed over the copper metal line 40.

As described above, in a method of forming a metal line in a semiconductor device according to embodiments, an insulating layer 70 may be selectively formed over a metal line, specifically, a copper metal line. Thus, it may be possible to reduce an effective dielectric value k of an interlayer insulating film in an entire Cu metal line, thereby decreasing the RC delay of the Cu metal line.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming an interlayer insulating film over a substrate;
   forming a via hole by selectively patterning the interlayer insulating film;
   forming a metal film over a surface of the interlayer insulating film including an inner portion of the via hole;
   filling the inner portion of the via hole with copper;
   deplating a copper layer exposed over the surface of the interlayer insulating film using reverse current to form a copper metal line and a recess region over the copper metal line;
   depositing an upper insulating film over the surface of the interlayer insulating film including the recess region; and
   selectively forming an insulating cap layer over only the recess region over the copper metal line by etching the upper insulating film.

2. The method of claim 1, wherein the upper insulating film and the insulating cap layer are made of a compound selected from the group consisting of SiN, SiCN and SiOC.

3. The method of claim 1, wherein the upper insulating film is deposited over the surface of the interlayer insulating film using a thermal deposition method.

4. The method of claim 1, wherein the upper insulating film is deposited over the surface of the interlayer insulating film using a plasma deposition method.

5. The method of claim 1, comprising coating an accelerating agent over a surface of the metal film before filling the inner portion of the via hole with copper after forming the metal film.

6. A method comprising:
   forming an interlayer insulating film over a substrate;
   forming a via hole by selectively patterning the interlayer insulating film;
   forming a metal film over a surface of the interlayer insulating film including an inner portion of the via hole;
   filling the inner portion of the via hole with copper;
   deplating a copper layer exposed over the surface of the interlayer insulating film to form a copper metal line and a recess region over the copper metal line;
   depositing an upper insulating film over the surface of the interlayer insulating film including the recess region; and
   selectively forming an insulating cap layer over only the recess region over the copper metal line by etching the upper insulating film,
   wherein a portion of the insulating cap layer and the metal film formed over the interlayer insulating film are planarized using a chemical mechanical planarization process.

7. The method of claim 6, wherein a thickness of the insulating cap layer remaining over the copper metal line is approximately equal to a thickness of the metal film.

8. A method comprising:
   forming an interlayer insulating film over a substrate;
   forming a via hole penetrating the interlayer insulating film;
   forming a metal barrier film over a surface of the interlayer insulating film including an inner portion of the via hole;
   coating an accelerating agent over a surface of the metal barrier film before filling the inner portion of the via hole after forming the metal barrier film;
   filling the inner portion of the via hole with a copper material, except for a top portion of the via hole, to form a copper metal line and a recess over the copper metal line; and
   filling the recess with an upper insulating film to form an insulating cap layer over the copper metal line.

9. The method of claim 8, wherein the upper insulating film and the insulating cap layer are made of a compound selected from the group consisting of SiN, SiCN and SiOC.

10. The method of claim 8, wherein the upper insulating film is deposited over the surface of the interlayer insulating film using a thermal deposition method.

11. The method of claim 8, wherein the upper insulating film is deposited over the surface of the interlayer insulating film using a plasma deposition method.

12. The method of claim 8, wherein filling the inner portion of the via hole with the copper material comprises deplating the copper material exposed over the surface of the interlayer insulating film using reverse current.

* * * * *